United States Patent [19]
Merrill

[11] Patent Number: 5,923,202
[45] Date of Patent: Jul. 13, 1999

[54] INPUT/OUTPUT OVERVOLTAGE CONTAINMENT CIRCUIT FOR IMPROVED LATCHUP PROTECTION

[75] Inventor: Richard B. Merrill, Woodside, Calif.

[73] Assignee: National Semiconductor Corporation, Santa Clara, Calif.

[21] Appl. No.: 08/810,543

[22] Filed: Mar. 3, 1997

[51] Int. Cl.$^6$ .............................. H02H 3/20; H02H 9/00
[52] U.S. Cl. .................. 327/318; 327/319; 327/327; 327/328; 361/91
[58] Field of Search ................................. 327/306, 309, 327/310, 312–314, 319, 321, 322, 324, 327, 328; 361/90, 91

[56] References Cited

U.S. PATENT DOCUMENTS 5,361,185  11/1994  Yu .............................................. 361/91
5,414,583  5/1995  Jordan ........................................ 361/91
5,473,169  12/1995  Ker et al. .................................. 361/91

OTHER PUBLICATIONS

Ming–Dou Ker, et al., "Transient Analysis of Submicron COMS Latchup With a Physical Criterion", Solid–State Electronics, vol. 37, No. 2, pp. 255–273, 1994.

Primary Examiner—Tuan T. Lam
Attorney, Agent, or Firm—Limbach & Limbach L.L.P.

[57] ABSTRACT

An I/O current containment circuit capable of protecting a semiconductor device from input current that may cause latchup includes a MOS drive circuit and a parasitic sensing circuit having multiple terminals. When the parasitic sensing circuit senses that a voltage level at an input/output transcends a particular voltage potential, the terminal generates a control signal which activates the drive circuit. The drive circuit then absorbs substantially all of the output current that could otherwise flow into the substrate of the semiconductor device.

17 Claims, 4 Drawing Sheets

INPUT/OUTPUT OVERVOLTAGE CONTAINMENT CIRCUIT FOR IMPROVED LATCHUP PROTECTION

BACKGROUND OF THE INVENTION

1. Field of the Invention

The present invention relates to the field of latchup in integrated circuits, and in particular, to an overvoltage containment circuit for protecting integrated semiconductor devices from input currents that may cause latchup.

2. Related Art

Conventional complementary metal oxide semiconductor (CMOS) integrated circuits (ICs) are inherently susceptible to latchup due to the close proximity of the n-channel and p-channel transistors to one another. Together with the semiconductor material forming the substrate of the integrated CMOS device, the diffused regions within the device can form parasitic transistors.

Latchup is a high current state accompanied by a collapsing or low-voltage condition established by a very low resistance path between the VDD voltage supply and circuit ground. When the parasitic transistors are biased appropriately, the transistors can effectively short the supply voltage to ground potential in latchup mode, causing a very large current to flow through the IC. This high current state can be triggered by application of a radiation transient or certain electrical excitations. At best, latchup only results in a disruption of the logic processes conducted by the CMOS device and, at worst, it results in destruction of the device. Furthermore, latchup continues to be an increasing problem due to the decrease in device dimensions and use of non-epitaxial substrates in integrated circuit fabrication to reduce crosstalk and cost.

FIG. 1a is a simplified cross-section of a conventional p-well n-substrate CMOS inverter circuit 100. A corresponding schematic diagram of the parasitic transistor configuration is shown in FIG. 1b, where bipolar transistor Q1 is the parasitic lateral p-n-p transistor, and bipolar transistor Q2 is the parasitic vertical n-p-n transistor. The emitter of the lateral transistor Q1 is the p+ source 113 and/or drain 115, while its base is the n-substrate 103 and its collector is the p-well 101. The n+ source 111 and/or drain 109 comprises the emitter of the vertical transistor Q2, while the p-well 101 forms its base and the n-substrate 103 its collector. Voltage supply VDD is applied at terminal 105 and circuit ground GND is applied at terminal 107. $V_{IN}$ and $V_{OUT}$ are the input and output terminals, respectively. The n+ source/drain regions 109, 111 comprise an N-channel MOS transistor while the p+ drain/source regions 113, 115 comprise the P-channel MOS transistor. The p+ region 117 forms an ohmic substrate 103 contact and n+ region 119 forms an ohmic p-well 101 contact. As shown in the schematic circuit diagram of FIG. 1b, currents I1 and I2 are the external trigger currents in the n-substrate 103 and p-well 101, respectively, which initiate transient latchup.

In the presence of external triggering currents I1, I2, such as a voltage overshoot, the emitter-base junction of a parasitic bipolar transistor Q1, Q2 becomes forward-biased. Typically, once this forward-biasing occurs, the number of minority carriers injected from the emitter of the bipolar transistor Q1, Q2 that reach the collector is reduced due to the parasitic minority carrier flow from the emitter directly into the substrate 103. This current flow into the substrate 103 causes the circuit to malfunction.

Transient overshoot voltages are a particular problem at the outputs of MOS driver circuits since impedance mismatches at the far ends of transmission lines result in reflections that return to the driver output node. Furthermore, overshoots are also common at input/output (I/O) device nodes where signals tend to be noisy. Thus, use of latchup preventive designs are very important at the input and output circuitry of CMOS chips.

Latchup may be prevented by holding the voltage of the substrate close to the voltage level of one of the supply voltage levels which may comprise, for example, ground potential. This may be accomplished by providing low resistance current paths to ground potential which are electronically coupled to the semiconductor substrate material. One method used to accomplish this in conventional devices is the use of a low resistance substrate having an epitaxial layer of semiconductor material formed outwardly from the low resistance layer. The use of epitaxial substrates is highly effective in preventing latchup but is a very expensive solution and is becoming more and more expensive as semiconductor wafer diameters increase. An alternate solution is the use of low resistance guard rings surrounding the n-channel device within the integrated CMOS structure constructed on a p-type semiconductor substrate. This solution is commonly used in input/output devices where the output pins of the integrated devices are susceptible to dramatic fluctuations due to external systems. The use of guard rings is effective but is, once again, very expensive in terms of the amount of surface area that must be dedicated to the guard rings.

Several other conventional methods have been used to prevent potential latchup in integrated circuits, such as the use of dielectric isolation to decouple the bipolar interaction with the MOS circuit. This method, while providing significant suppression of latchup, involves complicated processing, which makes it impractical. Another method of suppressing latchup is reducing carrier lifetimes around the regions where bipolar action takes place. This processing scheme involves ion implanting a minority carrier lifetime reducer ("MCLR") impurity into a CMOS integrated circuit so that the impurity is located in the active region of the parasitic bipolar transistor elements.

Although these conventional methods reduce latchup to a certain degree, they require the use of expensive epitaxial layers, complicated processing, or the dedication of semiconductor surface area to guard ring structures.

Thus, a need exists to minimize the current escaping into the non-epitaxial substrate, which in turn, improves latchup results.

SUMMARY OF INVENTION

An I/O voltage containment circuit having improved latchup protection is achieved by using parasitic bipolar transistors formed from the diffused regions within a CMOS device to shunt current to a MOS drive circuit. The MOS drive circuit then absorbs the current to prevent its escape into the semiconductor substrate where it can cause latchup.

In a preferred embodiment, the I/O containment circuit comprises an upper half and a lower half, both of which couple to an input/output node. The upper half of the containment circuit includes two P-channel MOS transistors coupled together in a current mirror configuration, and an n-p-n parasitic lateral bipolar transistor. This upper half is active when a negative trigger current is conveyed by the input/output node. This negative trigger current forward-biases the emitter of the n-p-n parasitic lateral bipolar transistor which injects electrons into the circuit. These electrons are collected by the collector of the parasitic transistor to provide bias for turning on the PMOS transistors. The two PMOS transistors then conduct the current such that a majority of the negative trigger current is absorbed, thereby preventing the escape of the current into the semiconductor substrate.

The lower half of the containment circuit includes two N-channel MOS transistor coupled together in a current mirror configuration, and a p-n-p parasitic lateral bipolar transistor. When a positive trigger current is received at the input/output pad, the emitter of the p-n-p parasitic lateral bipolar transistor is forward-biased. The emitter then injects holes into the circuit which are collected by a collector of the parasitic transistor to provide bias to turn on the two N-channel MOS transistors. These MOS transistors then conduct the current such that a majority of the positive trigger current is absorbed, thereby preventing the escape of the current into the semiconductor substrate.

BRIEF DESCRIPTION OF THE DRAWINGS

FIG. 1b illustrates a schematic diagram of the parasitic bipolar transistor circuit formed in the invertor of FIG. 1a.

DETAILED DESCRIPTION OF THE PREFERRED EMBODIMENT

Figure 1A:
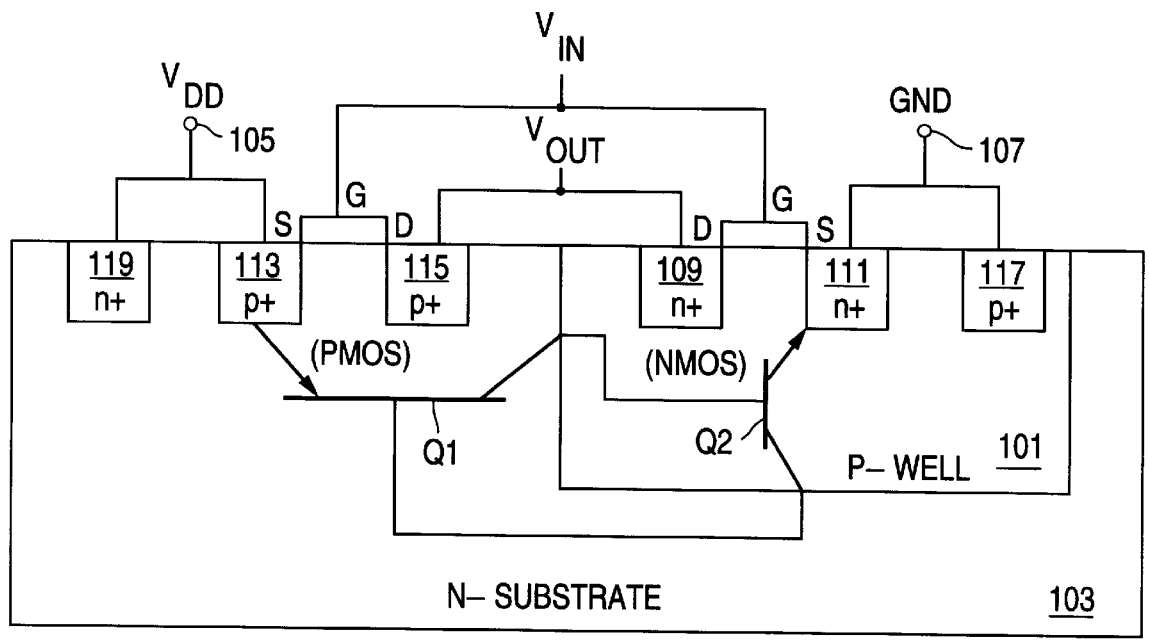
FIG. 1a illustrates a cross-section of a conventional CMOS inverter and its parasitic bipolar transistors.
Figure 1B:
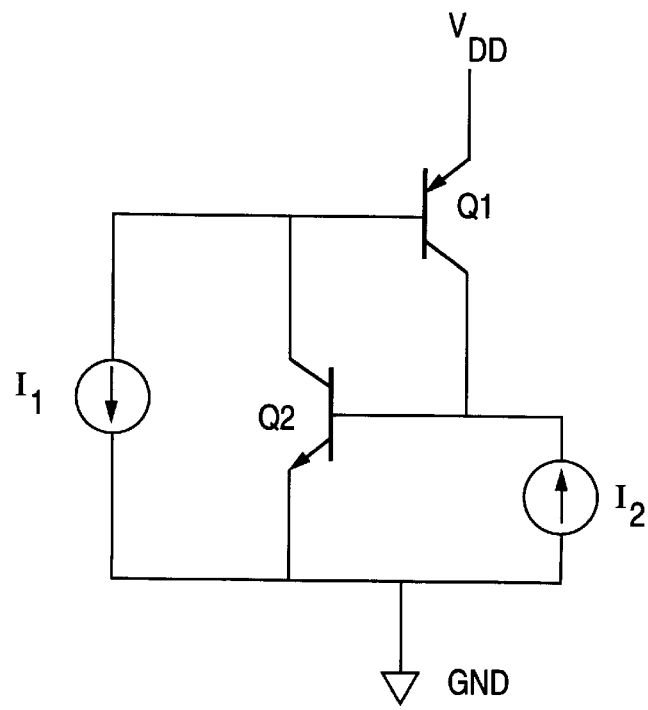
Figure 2:
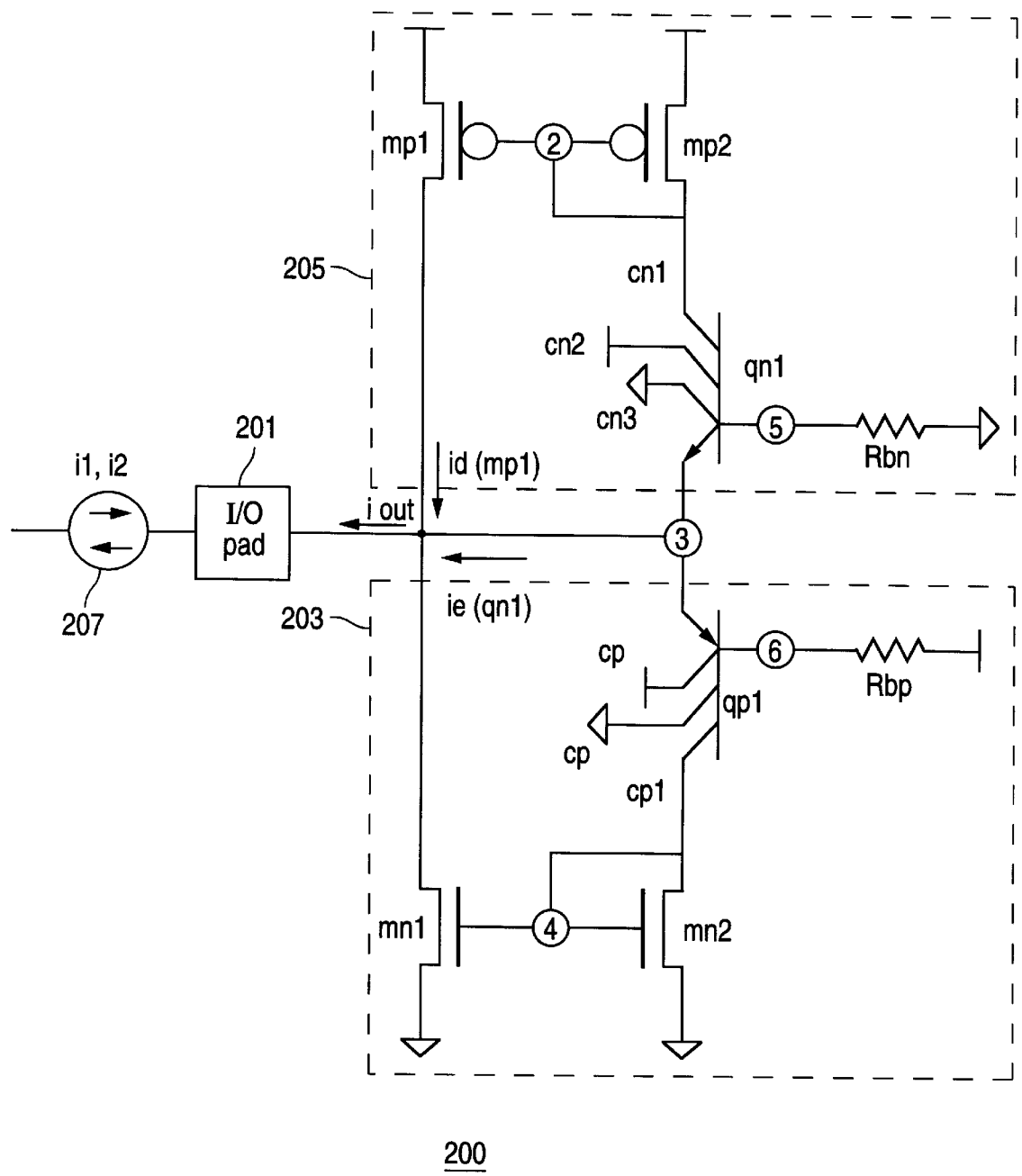
FIG. 2 illustrates a schematic diagram of a latchup current containment circuit in accordance with one embodiment of the present invention.

FIG. 2 illustrates, in schematic form, a latchup current containment circuit 200 in accordance with a preferred embodiment of the present invention. The function of this containment circuit 200 is to absorb transient currents to prevent their passage into the semiconductor substrate where they can cause latchup. As shown in FIG. 2, the containment circuit 200 has an input/output (I/O) pad 201, coupled to an I/O node 3. Typically, the containment circuit 200 is formed along the periphery of a semiconductor circuit, next to the I/O pad 201 which couples to circuitry in the interior portion of the semiconductor circuit.

The containment circuit 200 can absorb a majority of the current forced at an input and an output with normal MOS conduction. This MOS conduction can significantly reduce current escaping into the substrate (e.g., about ten-fold) and improve latchup immunity accordingly. The containment circuit 200 is activated when the voltage at the I/O node 3 is either raised above the normal operating level or lowered below the normal operating level, forcing current through the containment circuit 200. When the forced current received by the containment circuit 200 results from an increase in node voltage, e.g., due to positive transients, the lower half 203 of the containment circuit 200 is active. Large N-channel MOS (NMOS) driver transistor MN1 is turned on to provide MOS conduction to absorb a majority of the forced current to circuit ground. On the other hand, when the forced current results from a decrease in node voltage, e.g., due to negative transients, the upper half 205 of the containment circuit 200 is active. Large P-channel MOS (PMOS) driver transistor MP1 is turned on to provide MOS conduction to absorb a majority of the forced current from the voltage supply VDD.

PMOS transistor MP1 couples to PMOS transistor MP2 in a current mirror configuration. The gates of the PMOS transistors MP1, MP2 couple together and the sources of the transistors MP1, MP2 couple to voltage supply VDD. The drain of transistor MP1 couples to the I/O pad 201, and the drain of transistor MP2 couples to its gate and to collector cn1 of transistor QNI. Similarly, NMOS transistor MN1 couples to NMOS transistor MN2 in a current mirror configuration. The gates of the NMOS transistors MN1, MN2 couple together and the sources of the transistors MN1, MN2 couple to circuit ground. The drain of transistor MN1 couples to the I/O pad 201 and the drain of transistor MN2 couples to its gate and to collector cp1 of transistor QP1.

Figure 3:
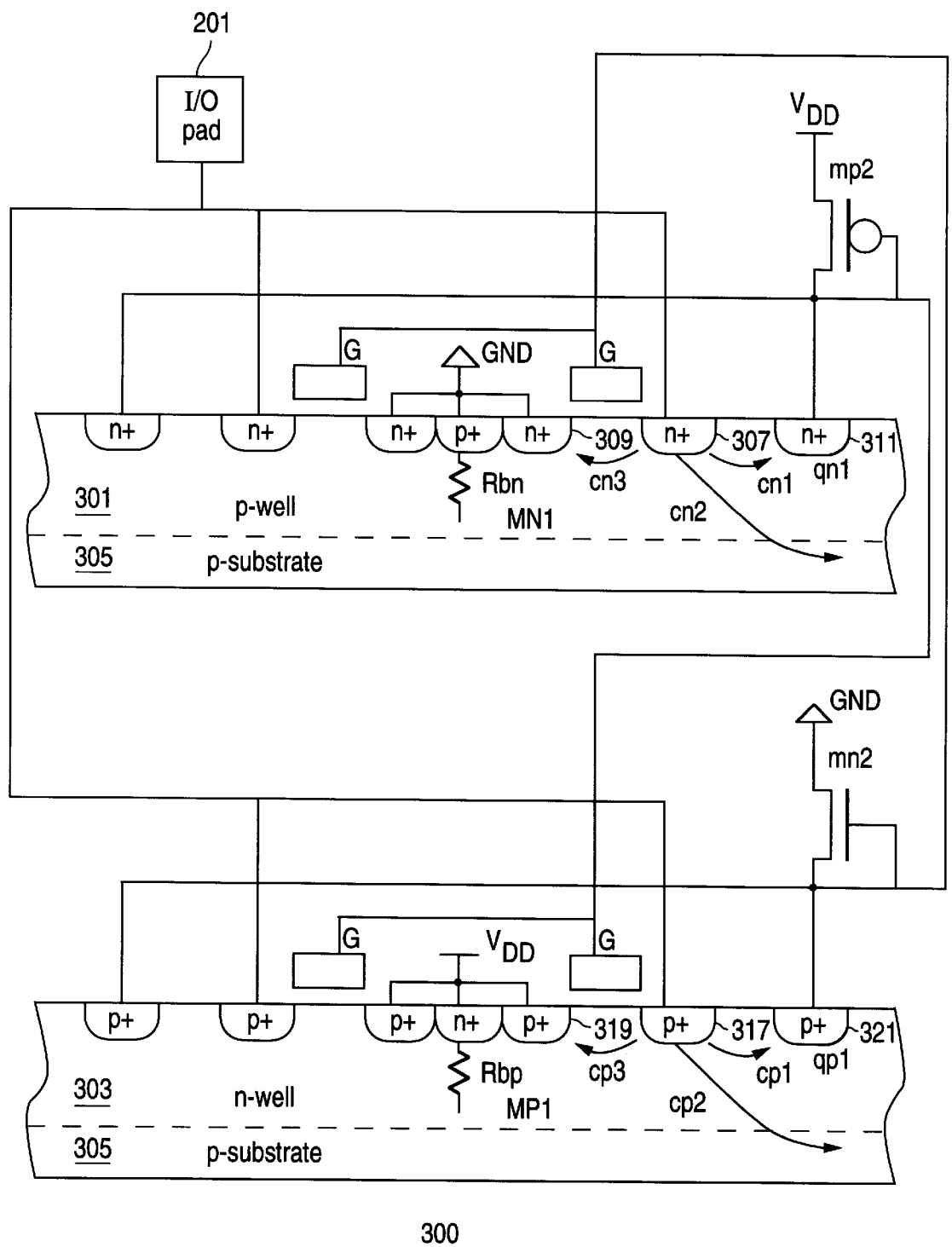
FIG. 3 illustrates a cross-section of the latchup current containment circuit of FIG. 2.

Transistors QN1 and QP1 are formed as the parasitic lateral bipolar transistors of the I/O driver transistors MN1 and MP1, respectively, as shown more explicitly in FIG. 3. The transistor action in these devices occurs in the lateral direction or parallel to the device surface, i.e., the minority carriers injected into the base of the transistors QN1, QP1 diffuse laterally toward the collector region.

Typically, conventional parasitic lateral bipolar transistors formed from CMOS transistors are three or four terminal devices, having one or two collectors, a base, and an emitter. The one or two collectors conduct current into the substrate and/or into ground. In contrast, in accordance with the present invention, transistors QN1 and QP1 are five terminal devices, having three collectors, a base, and an emitter. Collector cn1 is added to bipolar transistor QN1 such that when a negative triggering mechanism, such as a negative voltage overshoot, forward-biases the emitter-base junction of bipolar transistor QN1 causing a trigger current to flow through the emitter, collector cn1 can collect current that would otherwise flow into the substrate. This collected current is then conducted by the MOS transistors MP1 and MP2. Similarly, collector cp1 is added to bipolar transistor QP1 such that when a positive triggering mechanism, such as a positive voltage overshoot, forward-biases the emitter-base junction of bipolar transistor QP1 causing a trigger current to flow through the emitter, collector cp1 can collect current that would otherwise flow into the substrate. This collected current is then conducted by the MOS transistors MN1 and MN2.

Collectors cn1 and cp1 couple to the drains of transistors MP2 and MN2, respectively. Collectors cn2 and cp2 couple to the substrate, and collectors cn3 and cp3 couple to circuit ground. The emitters of the transistors QN1, QP1 couple to an I/O pad 201. This I/O pad 201 is a set of special metalization patterns exposed under the passivation layer of the wafer surface. Wires connect, or bond, to the metal of the I/O pad 201 and are bonded to a pin in the chip package. This establishes the connection from the chip to package leads.

As shown in FIG. 2, the I/O pad 201 can be tested with a force current source 207 generating currents i1 and i2. These currents i1, i2 are high value test currents which are injected into the containment circuit 200 to experimentally determine the effects of external transients and the susceptibility of the CMOS circuit to latchup. As a result, currents i1 and i2 activate the containment circuit 200 by forward-biasing the emitter-base junctions of the lateral bipolar transistors QN1, QP1.

Resistors Rbn and Rbp represent the base resistances of the lateral bipolar transistors QN1 and QP1, respectively. This base resistance is the resistance of the electrical path from the base contact to the edge of the emitter region. In a preferred embodiment the resistors Rbn, Rbp have relatively low values due to the large areas of the base-emitter junctions involved.

FIG. 3 illustrates a cross-section of a semiconductor substrate 300 in which the I/O containment circuit 200 has been formed with both a p-well 301 and an n-well 303 CMOS technology. While the substrate 305 of FIG. 3 may be created by forming an n-well 303 within a p-type substrate 305, it is to be appreciated by one skilled in the art that an analogous containment circuit 200 may be created by forming a p-well within an n-type substrate.

The parasitic bipolar transistors QN1 and QP1 are created by the MOS transistors MN1, MP1 formed in the containment circuit 200. The lateral bipolar transistor QN1 is formed from the NMOS I/O transistor MN1 as a result of the multiple n+ diffusions needed to fabricate the n-channel device. As can be seen, the transistor QN1 comprises n-type drain 307 of I/O NMOS transistor MN1, acting as an emitter of bipolar transistor QN1, p-type region (p-well) 301 acting as the base, and p-substrate 305 and n-type regions 309 and 311 acting as the collectors.

Similarly, the lateral bipolar transistor QP1 is formed from the PMOS I/O transistor MP1 as a result of the multiple p+ diffusions needed to fabricate the p-channel device. The transistor QP1 comprises p-type drain 317 of the PMOS I/O transistor MP1, acting as an emitter of bipolar transistor QP1, n-type region (n-well) acting as the base, and p-substrate 305 and p-type regions 319 and 321 acting as the collectors.

The containment circuit 200 of FIG. 2 is activated once the emitter-base junctions of either parasitic bipolar transistor QN1 or QP1 are forward-biased. Consider the following example where the containment circuit 200 is overvoltaged negative. The drain of the NMOS transistor MN1 is connected to the I/O pad 201 of the containment circuit 200. In NMOS transistors a positive voltage must be applied to the drain to keep the drain-substrate reverse-biased. In normal operation, when the output from the I/O pad 201 is high, the drain-substrate junction is reverse-biased, and latchup does not occur. Thus, the drain of the NMOS transistor MN1, which is the emitter of the lateral bipolar transistor QN1, is at a potential higher than or equal to that of the base region. However, if a negative transient is applied to the output, the voltage at the I/O node 3 transcends that of the normal operating level of the base region. When the voltage at the drain region (node 3) decreases by more than about 0.6 V (the threshold voltage of the NMOS transistor), the n-p drain/well junction of the NMOS transistor MN1 becomes forward-biased, thereby forward-biasing the emitter-base junction of parasitic bipolar transistor QN1. In other words, forward-biasing the n-p diode formed by the drain of the NMOS transistor MN1, forward-biases the emitter-base junction of parasitic bipolar transistor QN1. The n-type drain of the NMOS transistor then functions as an emitter, by injecting electrons as shown at the top of FIG. 3. In essence, a current flows through this emitter.

The emitted electrons have three possible paths. First, the electrons can be collected by the adjacent source 309 on the NMOS I/O driver transistor MN1, which is also collector cn3 of transistor QN1, biased at zero volts. Second, the electrons can be collected by collector cn2 where they can escape from the I/O vicinity and proceed into the p-substrate 305 and elsewhere in the IC where they might cause latchup. Third, the electrons can be collected by collector cn1 and provide bias for turning on the PMOS I/O driver transistor MP1.

Alternatively, the I/O containment circuit 200 can be overvoltaged positive due to the application of a positive transient to the I/O node 3 via the I/O pad 201. This causes the voltage at node 3 to rise and transcend the normal operating level. The p-n drain/well junction of the PMOS transistor MP1 becomes forward-biased, thereby forward-biasing the emitter-base junction of parasitic bipolar transistor QP1. In other words, forward biasing the p-n diode formed by the drain and channel/well of the PMOS transistor MP1 by raising the voltage of the drain above the n-well potential, will forward bias the emitter-base junction of parasitic bipolar transistor QP1. The p-type drain of the PMOS transistor MP1 then functions as an emitter, by injecting holes as shown at the bottom of FIG. 3. In essence, a current flows through this emitter.

The emitted holes have three possible paths. First, the holes can be collected by the adjacent source 319 on the PMOS I/O driver transistor MP1, which is also collector cp3 of transistor QP1, biased at zero volts. Second, the holes can be collected by collector cp2 where they can escape from the I/O vicinity and proceed into the p-substrate 305 and elsewhere in the IC where they might cause latchup. Third, the holes can be collected by collector cp1 and provide bias for turning on the NMOS I/O driver transistor MN1.

One purpose of this invention is to minimize the current in collectors cn2 and cp2 thereby limiting the current escaping from the I/O vicinity and flowing into the substrate. This object is achieved by having the MOS I/O driver transistors MP1, MN1 absorb as much of the forced current as possible which minimizes the lateral bipolar currents and therefore the escaped current into the substrate 305.

As shown in FIG. 3, collectors cn1, cn2, and cn3, and cp1, cp2, and cp3 are formed as stripes of n+ and p+ diffusion, respectively. The collectors are formed as close as possible to the emitters to maximize the efficiency of the lateral collection process in collector cn1 (active during negative transients) and collector cp1 (active during positive transients). If the distance between the emitter-base and collector-base junctions is small enough, the electric field can sweep most of the emitted electrons (or holes) over to the reverse-biased collector-base junction. There they are collected in the n+ collector cn1 or the p+ collector cp1, giving rise to an IC current that is almost as large as the forward-bias current of the emitter-base trigger current. Hence, the collector regions cn1, cp1 can collect the majority of carriers injected from the emitter, thereby minimizing the parasitic current flow into the substrate. The top half of FIG. 3 illustrates the direction of current flow of minority carriers (electrons) injected into the base region of the lateral bipolar transistor QN1, and the bottom half of FIG. 3 illustrates the direction of current flow of minority carriers (holes) injected into the base region of the lateral bipolar transistor QP1. Approximately half of the emitter current should reach either collector cn1 (active during negative transients) or collector cp1 (active during positive transients), since these collectors cn1, cp1 are more favorably biased and closer to the emitter than any other collector.

Figure 4:
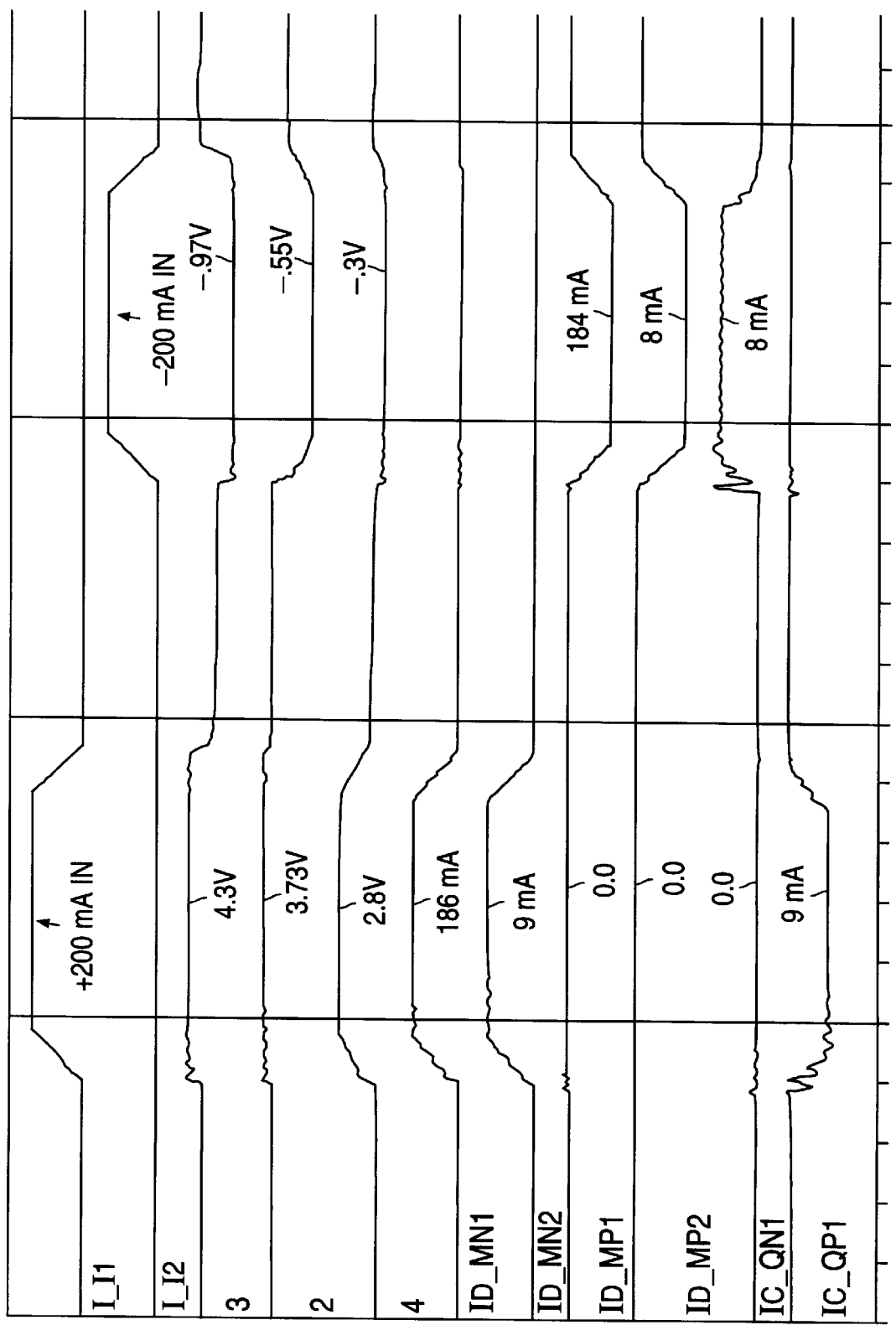
FIG. 4 illustrates a transient waveform analysis of the latchup current containment circuit of FIG. 2.

FIG. 4 illustrates the simulated waveformns at nodes 2–4, the drain currents of transistors MN1, MN2, MP1, and MP2, and the collector currents of transistors QN1 and QP1, when external trigger currents i1 and i2 are applied to the input/output pad 201 (node 3). This current i1, i2 is then forced into the containment circuit 200, forward biasing the emitter-base junction of the parasitic bipolar transistor QN1 or QP1. Measurements were taken when the ramp rate on the force current source 207 is about the maximum possible with VDD at 3 V.

Referring now to FIG. 2 in conjunction with FIG. 4, operation of the I/O overvoltage current containment circuit 200 will now be explained when a positive transient, represented as i1, is received by the I/O pad 201 at node 3. In this simulation, current i1 has a value of 200 ma since 200 ma is considered to be a good latchup tolerance. The current i1 overvoltages the I/O pad 201 positive by causing an increase in the voltage at the I/O pad 201 above that of the normal operating level. In the simulation, the node voltage was raised to 4.3 V. This forces current $-i_{out}$ from the I/O pad 201, causing the emitter current $ie_{QP1}$ to turn on transistor QP1. Collector cp1 conducts collector current $ic_{QP1}$, which in the simulation has an empirical value of about 9 ma. This current $ic_{QP1}$ causes the voltage at the gate of transistors MN1 and MN2, shown as node 4, to rise. In the simulation, the voltage at node 4 increased to 2.8 V. When the gate voltages of transistors MN1 and MN2 reach the threshold value, transistors MN1 and MN2 switch on and begin conducting. This will provide a conducting path for the overvoltage transients applied to the I/O pad 201 to be absorbed through transistor MN1 to ground. Transistors MP1 and MP2 are inactive, and the gate voltage of these transistors, shown as node 2, remains close to 3 V. As a result, none of the forced current flows through these transistors.

As described above, transistors MN1 and MN2 are coupled together in a current mirror configuration. Therefore, the gate-to-source voltages are equal. As a result, when transistors MN1 and MN2 operate in saturation, the channel current through transistor MN1 is equal to a constant aspect ratio (gain ratio) of channel current through transistor MN2. This gain ratio is equal to W/L of transistor MN1, divided by W/L of transistor MN2, where W is the effective width of the channel region in the transistor under the gate electrode separating the source and drain, and L is the effective length of such channel region. In a preferred embodiment, the NMOS driver transistor MN1 has a W/L value of 500/.4 to enable it to absorb the maximum available forced current i1, about 200 ma, with the maximum voltages available in a 3 V process. Since the preferred W/L value of transistor MN2 is 25/.4, the gain factor is about 20. In the simulation, transistor MN2 conducts current $id_{MN2}$ having an empirical value of about 8 ma and NMOS transistor MN1 provides current $id_{MN1}$ having an empirical value of about 186 ma.

The 186 ma current, is the amount of current absorbed into ground by transistor MN1. This is over 90% of the 200 ma forced current i1. Therefore, a result of the current containment circuit 200 is that a significant portion of the current being forced is confined to the feedback loop due to the current conducting MOS transistors MN1, MN2.

Similarly, the operation of current containment circuit 200 can be explained when a negative transient, represented as current i2 is received at the I/O pad 201. In the simulation, current i2 was also chosen to have a value of −200 ma. The negative transient overvoltages the I/O containment circuit 200 by lowering the voltage at node 3 below that of the normal operating level. In the simulation, the node voltage was lowered to almost −1 Volt. This forces current $i_{Out}$ from the I/O pad 201 at node 3, causing emitter current $ie_{QN1}$ to turn on transistor QN1. Collector cn1 conducts collector current $ic_{QN1}$, which in the simulation has an empirical value of about 8 ma. This current $ic_{QN1}$ causes the voltage on the gate of transistors MP1 and MP2, shown as node 2, to rise. In the simulation, the voltage at node 2 increased to 0.55 V. Once the gate voltage of the transistors MP1, MP2 reaches the threshold value, transistors MP1 and MP2 switch on and begin conducting. During this time transistors MN1 and MN2 are inactive, and the gate voltage of these transistors MN1, MN2, shown as node 4, remains almost at 0 V. As a result none of the forced current flows through these transistors.

As described above, transistors MP2 and MP1 are coupled together in a current mirror configuration. Therefore the gate-to-source voltages of the transistors MP2, MP1 are equal. The current through transistor MP1 is equal to a gain ratio of current through transistor MP2. This gain ratio is equal to W/L of transistor MP1, divided by W/L of transistor MP2. In a preferred embodiment, the PMOS driver transistor MP1 has a W/L value of 1000/.4 to enable it to absorb the maximum available forced current i2, about 200 ma, with the maximum voltages available in a 3 V process. Since the preferred values of transistor MP2 is 50/.4 the gain ratio is about 20. Given the current mirror configuration, in the simulation, transistor MP2 pulls current $id_{MP2}$ having an empirical value of about 8 ma, and transistor provides current $id_{MP1}$ having an empirical value of about 184 ma.

The 184 ma current, represented as current $id_{MP1}$ in FIG. 2, is the amount of current absorbed by I/O driver transistor MP1. This is over 90% of the forced current i2, which is 200 ma. Again, the result of the I/O current containment circuit 200 is that a significant portion of the forced current is confined to the feedback loop due to the current conducting MOS transistors. Furthermore, as transistor MP1 shunts away the positive transients, the voltage at the I/O pad 201 is lowered. This lowers the voltage applied to the transistor QN1 and therefore the voltage applied to the gates of transistors MP1 and MP2, turning off transistors MP1 and MP2.

The negative feedback path of the containment circuit 200 has several advantages. Without the feedback path much of the current that is conducted by the MOS transistors would flow into the substrate. Additionally, the negative feedback path provides stability and resists oscillation in the presence of overstress on the I/O pad 201.

One advantage of using lateral bipolar transistors QN1, QP1 in the I/O containment circuit 200 is their ability to provide current gain at high frequencies. The high frequency behavior of a bipolar transistor is measured by the unity-gain frequency, $f_T$, which is the frequency at which the current gain of the transistor decreases to unity. The value of $f_T$ is measured by using the following equation:

$f_T=1/(2*\pi*T)$, where T is the transit time of the bipolar transistor and is approximately equal to the base transit time, or the average time per carrier spent in diffusing across the neutral base region of width $W_B$. Since the base width, and the effective channel length, $L_{eff}$, are small, and a deep submicron process is employed to reduce the delay in charging the capacitances connected to the collectors, $f_T$ for the lateral bipolar transistors QN1, QP1 is high.

A further advantage of the I/O containment circuit 200 is the negligible leakage current. The I/O leakage current when neither I/O driver transistor MN1, MP1 is forward-biased is determined by the junction leakage of the diodes associated with collectors cn1 and cp1, with an increase ratio due to the current mirror gain. In a preferred embodiment, the gain is 20. Junction leakage for most CMOS processes is on the order of 1 nanoamp/$cm^2$. Thus, for a 1000 $\mu m^2$ collector cp1 junction, this provides a leakage current of 0.01 picoamp, which yields a leakage current in transistor MP1 of 0.2 picoamp (0.01 picoamp multiplied by a current mirror gain of 20). This is a negligible current.

With normal MOS conduction, the I/O containment circuit 200 can absorb a substantial portion, over 90% as determined in the simulation, of the current forced at the input/output node 3 of the containment circuit 200. This absorption reduces the current escaping into the substrate ten-fold and improves latchup results accordingly. Variations in the current gain of transistor QN1, or the proportions of current in collector cn1 compared to collectors cn2 or cn3, can be made up by adjusting the gain factor equal to MP1 (W/L of PMOS transistor MP1) divided by MP2 (W/L of PMOS transistor MP2) to maintain the desired amount of current sourcing from PMOS transistor MP1. Similarly, variations in the current gain of transistor QP1, or the proportions of current in collector cp1 compared to collectors cp2 or cp3, can be made up by adjusting the gain factor equal to MN1 (W/L of NMOS transistor MN1) divided by MN2 (W/L of NMOS transistor MN2) to maintain the desired amount of current sourcing from NMOS transistor MN1.

Another important factor in reducing latchup in ICs is the transient response of the lateral bipolar transistors QN1, QP1. In order for the containment circuit 200 to be latched, a minimum latchup trigger time for which the stimulus must be present must be satisfied. Since latchup is typically induced by transient triggering, the transit time for minority carriers across the base region is a measure of the transient response time of the bipolar transistors QN1, QP1. In a preferred embodiment of the present invention, the containment circuit 200 has a transient response time of approximately one nanosecond and is quite stable due to a low gain and a small phase delay around the loop. As a result, the containment circuit 200 is helpful for absorbing overvoltage transients, as well as deterring DC latchup situations.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus including an integrated current containment circuit for limiting latchup in a functional circuit, said containment circuit comprising:
   a circuit node configured to couple to the functional circuit and to convey a circuit current;
   a first drive circuit coupled to said circuit node; and
   a first parasitic current sensing circuit coupled between said circuit node and said first drive circuit, said first parasitic current sensing circuit having a first terminal coupled to a first voltage potential, a second terminal coupled to a second voltage potential, and a third terminal coupled to said first drive circuit, wherein
   when said first parasitic current sensing circuit senses that a voltage level at said circuit node has transcended said first potential, said third terminal generates a signal activating said first drive circuit which in response thereto drives substantially all of said circuit current away from the functional circuit.

2. An apparatus including an integrated current containment circuit for limiting latchup in a functional circuit, said containment circuit comprising:
   a circuit node configured to couple to the functional circuit and to convey a circuit current;
   a first drive circuit coupled to said circuit node; and
   a first parasitic current sensing circuit coupled between said circuit node and said first drive circuit, said first parasitic current sensing circuit having a first terminal coupled to a first voltage potential, a second terminal coupled to a second voltage potential, and a third terminal coupled to said first drive circuit, wherein
   when said first parasitic current sensing circuit senses that a voltage level at said circuit node has transcended said first potential, said third terminal generates a signal activating said first drive circuit which in response thereto drives substantially all of said circuit current away from the functional circuit, and
   wherein said first drive circuit is a current mirror circuit.

3. The apparatus of claim 1, wherein said first voltage potential is a power supply and said second voltage potential is cizuit ground.

4. An apparatus including an integrated current containment circuit for limiting latchup in a functional circuit, said containment circuit comprising;
   a circuit node configured to couple to the functional circuit and to convey a circuit current;
   a first drive circuit coupled to said circuit node; and
   a first parasitic current sensing circuit coupled between said circuit node and said first drive circuit, said first parasitic current sensing circuit having a first terminal coupled to a first voltage potential, a second terminal coupled to a second voltage potential, and a third terminal coupled to said first drive circuit, wherein
   when said first parasitic current sensing circuit senses that a voltage level at said circuit node has transcended said first potential, said third terminal generates a signal activating said first drive circuit which in response thereto drives substantially all of said circuit current away from the functional circuit, and
   wherein said first parasitic current sensing circuit comprises an underlying parasitic bipolar transistor formed from a metal oxide semiconductor transistor disposed in a semiconductor substrate.

5. The apparatus of claim 4, wherein said first terminal, said second terminal, and said third terminal comprise a first collector, a second collector, and a third collector, respectively, of said underlying parasitic bipolar transistor.

6. An apparatus including an integrated current containment circuit for limiting latchup in a functional circuit, said containment circuit comprising:
   a circuit node configured to couple to the functional circuit and to convey a circuit current;
   a first drive circuit coupled to said circuit node;
   a first parasitic current sensing circuit coupled between said circuit node and said first drive circuit, said first parasitic current sensing circuit having a first terminal coupled to a first voltage potential, a second terminal coupled to a second voltage potential, and a third terminal coupled to said first drive circuit, wherein
   when said first parasitic current sensing circuit senses that a voltage level at said circuit node has transcended said first potential, said third terminal generates a signal activating said first drive circuit which in response thereto drives substantially all of said circuit current away from the functional circuit, and
   a second drive circuit coupled to said circuit node; and
   a second parasitic current sensing circuit of said first drive circuit and coupled between said circuit node and said second drive circuit, said second parasitic current sensing circuit having a fourth terminal coupled to said first voltage potential, a fifth terminal coupled to said second voltage potential, and a sixth terminal coupled to said second drive circuit, wherein when said second parasitic current sensing circuit senses that a voltage level at said circuit node has transcended said second voltage potential, said sixth terminal generates a signal activating said second drive circuit which in response thereto drives substantially all of said circuit current away from the functional circuit.

7. The apparatus of claim 6, wherein said second drive circuit comprises a second current mirror circuit.

8. The apparatus of claim 6, wherein said first parasitic current sensing circuit comprises a first underlying parasitic bipolar transistor formed from said second drive circuit, and said second parasitic current sensing circuit comprises a second underlying parasitic bipolar transistor forested from said first drive circuit.

9. The apparatus of claim 8, wherein said first underlying bipolar transistor is formed from a first metal oxide semiconductor (MOS) transistor in said second drive circuit disposed in a semiconductor substrate, and said second underlying bipolar transistor is formed from a second MOS transistor in said first drive circuit disposed in said semiconductor substrate.

10. The apparatus of claim 8, wherein said first, second and third terminals comprise a first collector, a second collector, and a third collector, respectively, of said first underlying bipolar transistor, and said fourth, fifth, and sixth terminals comprise a fourth collector, a fifth collector, and a sixth collector, respectively, of said second underlying bipolar transistor.

11. An apparatus including an integrated current containment circuit for limiting latchup in a functional circuit, said containment circuit comprising:
a circuit node configured to couple to the functional circuit and to convey a circuit current;
a first drive circuit having a first drive transistor coupled between said circuit node and a first voltage potential;
a second drive circuit having a second drive transistor coupled between said circuit node and a second voltage potential;
a first parasitic current sensing circuit formed from said first drive circuit and coupled between said circuit node and said second drive circuit, said first parasitic current sensing circuit having a first terminal coupled to said first voltage potential, a second terminal coupled to said second voltage potential, and a third terminal coupled to said second drive circuit, wherein
when said first parasitic current sensing circuit senses that a voltage level at said circuit node has transcended said first potential, said third terminal generates a signal activating said second drive circuit which in response thereto drives substantially all of said circuit current away from the functional circuit; and
a second parasitic current sensing circuit formed from said second drive circuit and coupled between said circuit node and said first drive circuit, said second parasitic current sensing circuit having a fourth terminal coupled to said first voltage potential, a fifth terminal coupled to said second voltage potential, and a sixth terminal coupled to said first drive circuit, wherein
when said second parasitic current sensing circuit senses that said voltage level at said circuit node has transcended said second potential, said sixth terminal generates a signal activating said first drive circuit which in response thereto drives substantially all of said circuit current away from the functional circuit.

12. The apparatus of claim 11, wherein said first drive circuit comprises a first metal oxide semiconductor (MOS) transistor and said second drive circuit comprises a second MOS transistor.

13. The apparatus of claim 12, wherein said first parasitic current sensing circuit comprises a first underlying parasitic bipolar transistor formed from said first MOS transistor and said second parasitic current sensing circuit comprises a second underlying parasitic bipolar transistor formed from said second MOS transistor.

14. The apparatus of claim 13, wherein said first, second and third terminals comprise a first collector, a second collector, and a third collector, respectively, of said first underlying parasitic bipolar transistor, and said fourth, fifth and sixth terminals comprise a fourth collector, a fifth collector, and a sixth collector, respectively, of said second underlying parasitic bipolar transistor.

15. A method of limiting latchup in a functional circuit, said method comprising the steps of:
sensing by a first terminal of a first parasitic current sensing circuit when a voltage level of a circuit node has transcended a first voltage potential and in accordance therewith generating a first circuit current;
receiving said first circuit current by a second terminal of said first parasitic current sensing circuit and in accordance therewith generating a first control signal; and
receiving said first control signal with a first drive circuit which in response thereto drives substantially all current from said circuit node away from the functional circuit.

16. A method of limiting latchup in a functional circuit, said method comprising the steps of:
sensing by a first terminal of a first parasitic current sensing circuit when a voltage level of a circuit node has transcended a first voltage potential and in accordance therewith generating a first circuit current;
receiving said first circuit current by a second terminal of said first parasitic current sensing circuit and in accordance therewith generating a first control signal;
receiving said first control signal with a first drive circuit which in response thereto drives substantially all current from said circuit node away from the functional circuit;
sensing by a third terminal of a second parasitic current sensing circuit when the voltage level of the circuit node has transcended a second voltage potential and in accordance therewith generating a second circuit current;
receiving said second circuit current by a fourth terminal of said second parasitic current sensing circuit and in accordance therewith generating a second control signal; and
receiving said second control signal with a second drive circuit which in response thereto drives substantially all of said current from said circuit node away from the functional circuit.

17. A method of limiting latchup in a functional circuit, said method comprising the steps of:
sensing by a first terminal of a first parasitic current sensing circuit formed from a first drive circuit, when a voltage level of a circuit node has transcended a first voltage potential and in accordance therewith generating a circuit current;
receiving said circuit current by a second terminal of said first parasitic current sensing circuit and in accordance therewith generating a first control signal; and receiving said first control signal with said first drive circuit which in response thereto drives substantially all current from said circuit node away from the functional circuit;

sensing by a third terminal of a second parasitic current sensing circuit formed from a second drive circuit, when a voltage level of a circuit node has transcended a second voltage potential and in accordance therewith generating a second circuit current;

receiving said second circuit current by a fourth terminal of said second parasitic current sensing circuit and in accordance therewith generating a second control signal; and receiving said second control signal with said second drive circuit which in response thereto drives substantially all of said current from said circuit node away from the functional circuit.

\* \* \* \* \*

UNITED STATES PATENT AND TRADEMARK OFFICE
CERTIFICATE OF CORRECTION

PATENT NO. : 5,923,202
DATED : July 13, 1999
INVENTOR(S) : Richard B. Merrill

It is certified that error appears in the above-identified patent and that said Letters Patent is hereby corrected as shown below:

Col. 10, line 14, delete "cizuit" and replace with --circuit--.

Col. 10, line 17, delete ";" and replace with --:--.

Col. 11, line 14, delete "forested" and replace with --formed--.

Signed and Sealed this

Seventh Day of December, 1999

Attest:

Q. TODD DICKINSON

*Attesting Officer*    *Acting Commissioner of Patents and Trademarks*